United States Patent
Li et al.

(10) Patent No.: US 11,695,339 B2
(45) Date of Patent: Jul. 4, 2023

(54) DUAL MODE SUPPLY CIRCUIT AND METHOD

(71) Applicants: TAIWAN SEMICONDUCTOR MANUFACTURING COMPANY, LTD., Hsinchu (TW); TSMC CHINA COMPANY, LIMITED, Songjiang (CN)

(72) Inventors: Wei Li, Hsinchu (TW); Yongliang Jin, Hsinchu (TW); Yaqi Ma, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 0 days.

(21) Appl. No.: 18/053,022

(22) Filed: Nov. 7, 2022

(65) Prior Publication Data
US 2023/0083606 A1    Mar. 16, 2023

Related U.S. Application Data

(63) Continuation of application No. 17/238,837, filed on Apr. 23, 2021, now Pat. No. 11,509,224.

(30) Foreign Application Priority Data

Feb. 7, 2021    (CN) .......................... 202110168468.1

(51) Int. Cl.
*H02M 3/158*    (2006.01)
*H02M 1/00*    (2006.01)
*H03K 19/003*    (2006.01)

(52) U.S. Cl.
CPC ......... *H02M 3/158* (2013.01); *H02M 1/0032* (2021.05); *H02M 1/0003* (2021.05); *H02M 3/1588* (2013.01); *H03K 19/003* (2013.01)

(58) Field of Classification Search
None
See application file for complete search history.

(56) References Cited

U.S. PATENT DOCUMENTS 8,564,583 B2    10/2013  Liang et al.
8,710,914 B1 *   4/2014  Guhados ................... G05F 1/10
                                                        327/540

(Continued)

FOREIGN PATENT DOCUMENTS

DE    102019118013    2/2020
KR    20200123348    10/2020

(Continued)

OTHER PUBLICATIONS

Notice of Allowance dated Aug. 23, 2022 for corresponding application No. KR 10-2021-0079191 (pp. 1-8).

(Continued)

*Primary Examiner* — Matthew V Nguyen
(74) *Attorney, Agent, or Firm* — Hauptman Ham, LLP

(57) ABSTRACT

A circuit includes an output node and an amplifier and first and second branches coupled between power supply and reference nodes. The first branch includes a first switching device coupled between a first amplifier input and the reference node, the second branch includes a second switching device coupled between the output node and a second amplifier input, and a third switching device is coupled between the power supply and output nodes. Responsive to a first voltage level on the power supply node, each of the first and second switching devices is switched off and the third switching device is switched on, and responsive to a second voltage level on the power supply node greater than (Continued)

the first voltage level, each of the first and second switching devices is switched on and the third switching device is switched off.

20 Claims, 8 Drawing Sheets

(56) References Cited

U.S. PATENT DOCUMENTS

| | | | |
|---|---|---|---|
| 9,143,148 B2* | 9/2015 | Nishimura | H03M 1/1061 |
| 2012/0187933 A1 | 7/2012 | Reddy et al. | |
| 2014/0117957 A1 | 5/2014 | Usuda | |
| 2014/0145698 A1* | 5/2014 | Saito | H02M 1/32 |
| | | | 323/285 |
| 2018/0262106 A1* | 9/2018 | Chakkirala | H02M 3/158 |
| 2019/0165747 A1 | 5/2019 | Couglar et al. | |

FOREIGN PATENT DOCUMENTS

| | | |
|---|---|---|
| TW | I572135 | 2/2017 |
| TW | 202032138 | 9/2020 |

OTHER PUBLICATIONS

Office Action dated Jun. 28, 2022 from corresponding case No. TW 11120627600 (pp. 1-4).

* cited by examiner

300A

300B

300C

300D

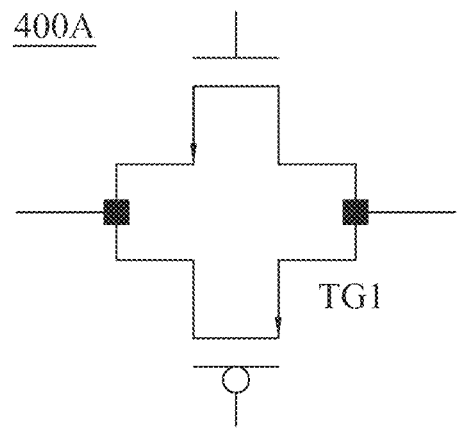
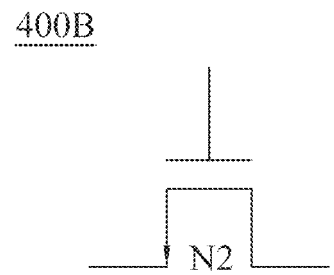
FIG. 4A               FIG. 4B
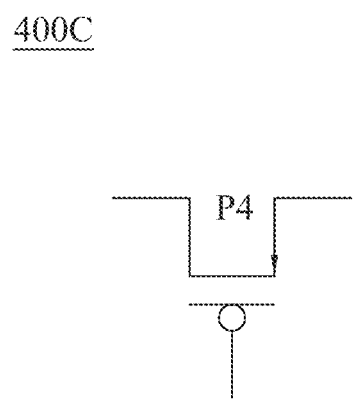
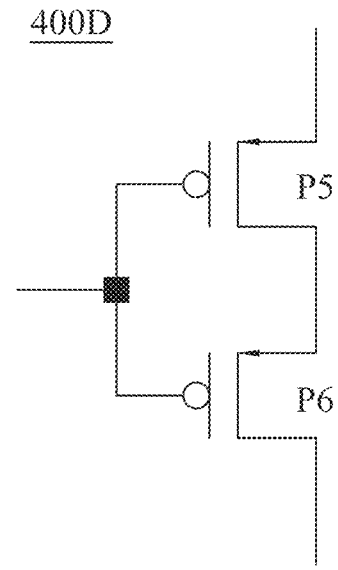
FIG. 4C               FIG. 4D

500A

500B

500C

600

| 610 | Receive a power supply voltage at a power supply node |

| 620 | Receive a mode select signal having a first logical level indicative of the power supply voltage having a first voltage level; generate a first mode control signal having a second logical level complementary to the first logical level |

| 630 | In response to the first mode control signal having the second logical level, use a first switching device to decouple a bias path from a reference node, use a second switching device to decouple a feedback path from an output node, and use a third switching device to couple the output node to the power supply node |

| 640 | Receive the mode select signal having the second logical level indicative of the power supply voltage having a second voltage level greater than the first voltage level, and generate the first mode control signal having the first logical level |

| 650 | In response to the first mode control signal having the first logical level, use the first switching device to couple the bias path to the reference node, use the second switching device to couple the feedback path to the output node, use the third switching device to decouple the output node from the power supply node, and use an amplifier to control an output voltage on the output node |

FIG. 6

DUAL MODE SUPPLY CIRCUIT AND METHOD

PRIORITY CLAIM

The present application is a continuation of U.S. application Ser. No. 17/238,837 filed Apr. 23, 2021, now U.S. Pat. No. 11,509,224, which claims the priority of China Application No. 202110168468.1, filed Feb. 7, 2021, which are incorporated herein by reference in their entireties.

BACKGROUND

An integrated circuit (IC) commonly includes a core portion and an input-output (I/O) portion. The I/O portion functions as an interface, or buffer, between core circuits and circuits external to the IC, and has an operating voltage range based on the technology used to manufacture the IC, e.g., a baseline feature size technology node. In some applications, an I/O buffer needs to be capable of operating in dual power modes: a first power mode in which an external power voltage level matches the internal operating voltage range, and a second power mode in which an external power voltage level is greater than the internal operating voltage range, e.g., twice as great as the internal operating voltage range. Example applications include secure digital (SD) card and reduced gigabit media-independent interface (RGMII) circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4D are schematic diagrams of switching devices, in accordance with some embodiments.

FIG. 6 is a flowchart of a method of operating a dual mode circuit, in accordance with some embodiments.

DETAILED DESCRIPTION

Figure 1A:
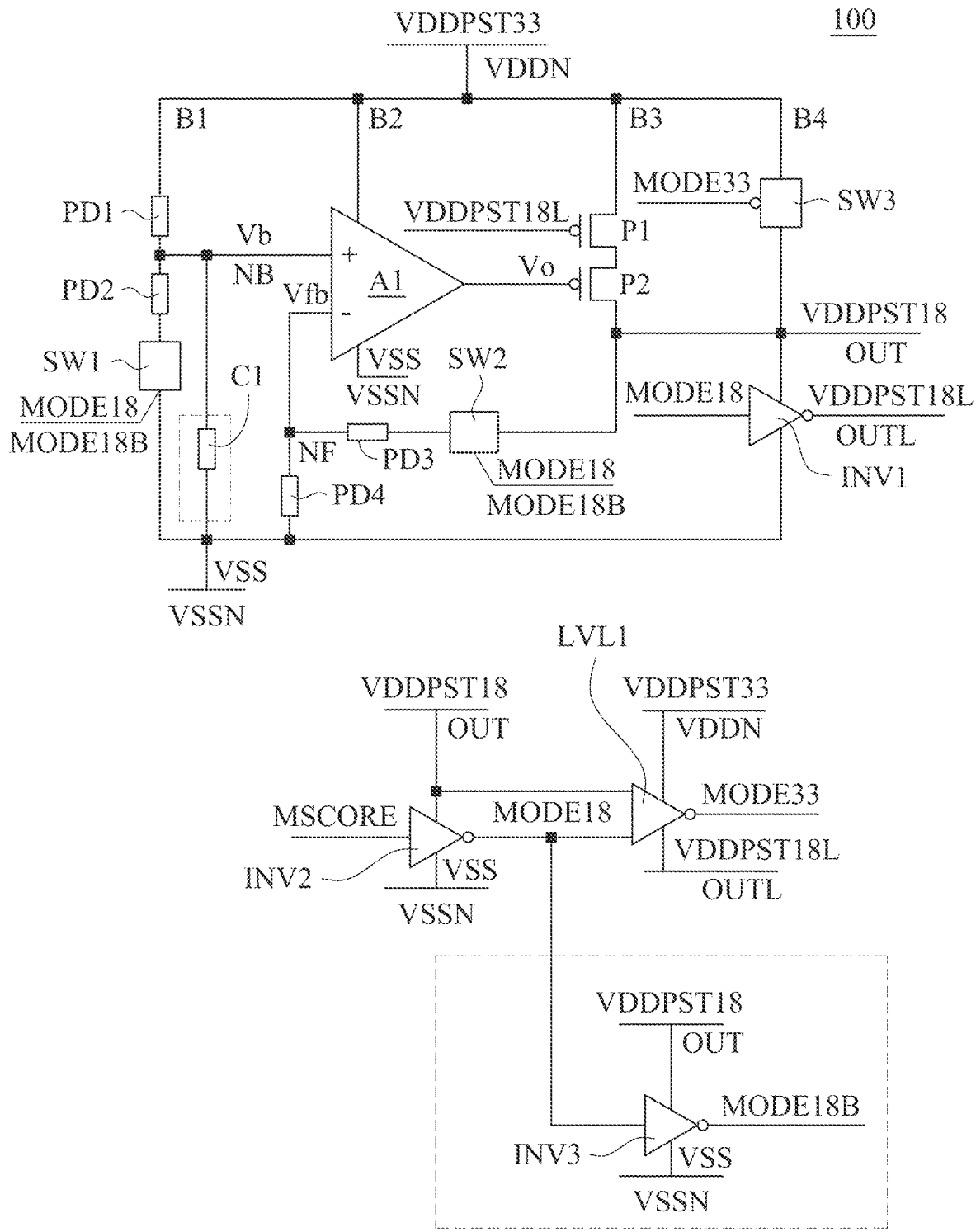
FIGS. 1A-1C are schematic diagrams of a dual mode circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a dual mode supply circuit includes enabling circuits coupled to amplifier input terminals such that the generation of reference and feedback voltages is enabled only for high voltage mode operation. By disabling generation of reference and feedback voltages for low voltage mode operation, a power-up sequence includes coupling an output node to a power input node before the amplifier is otherwise capable of controlling the output node. Compared to approaches that do not include enabling circuits coupled to amplifier input terminals, the dual mode supply circuit thereby improves the reliability of the power-up sequence for low voltage mode operation. Further, disabling generation of reference and feedback voltages reduces standby leakage current during low voltage mode operation compared to approaches that do not include enabling circuits coupled to amplifier input terminals.

Figure 1B:
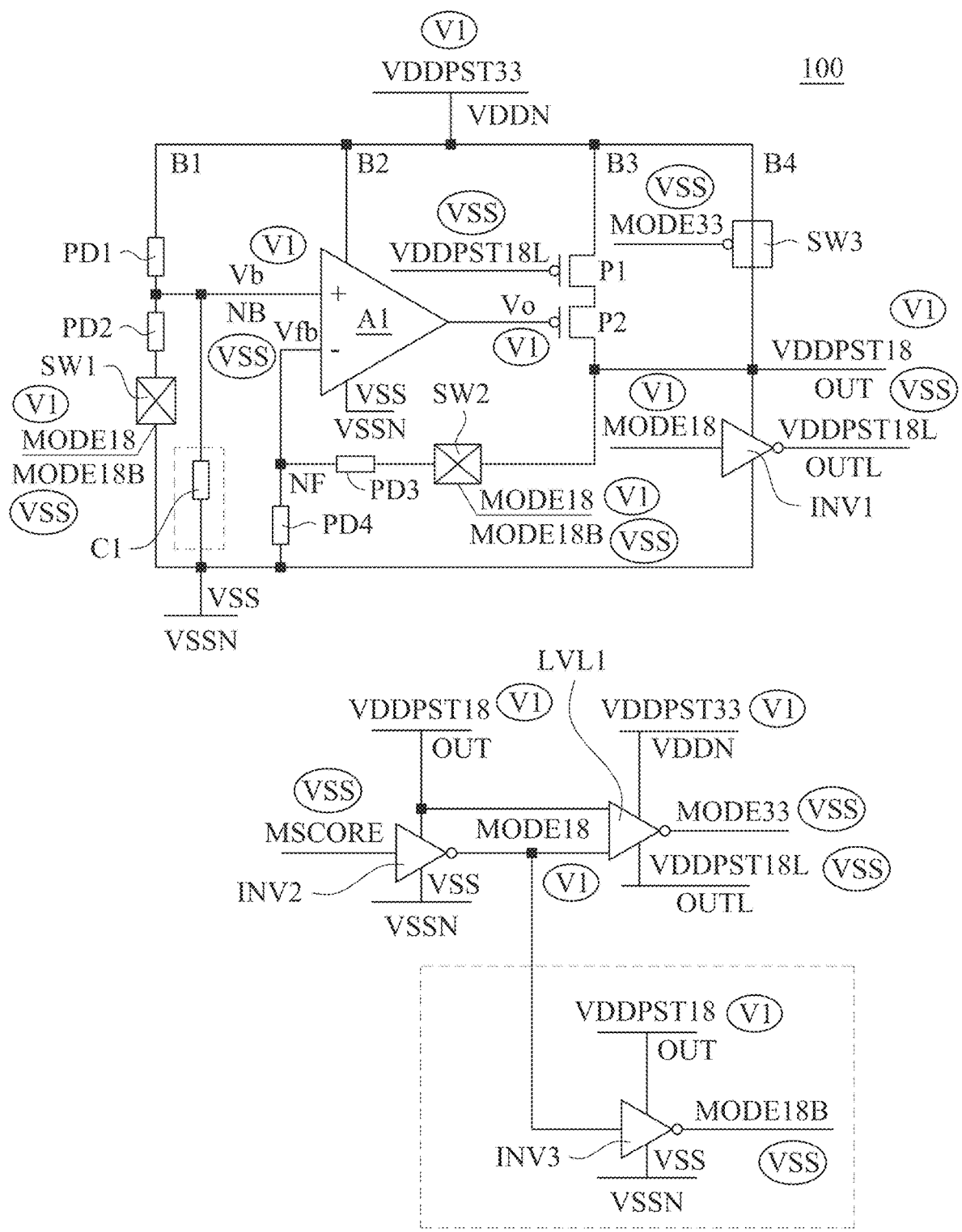
Figure 1C:
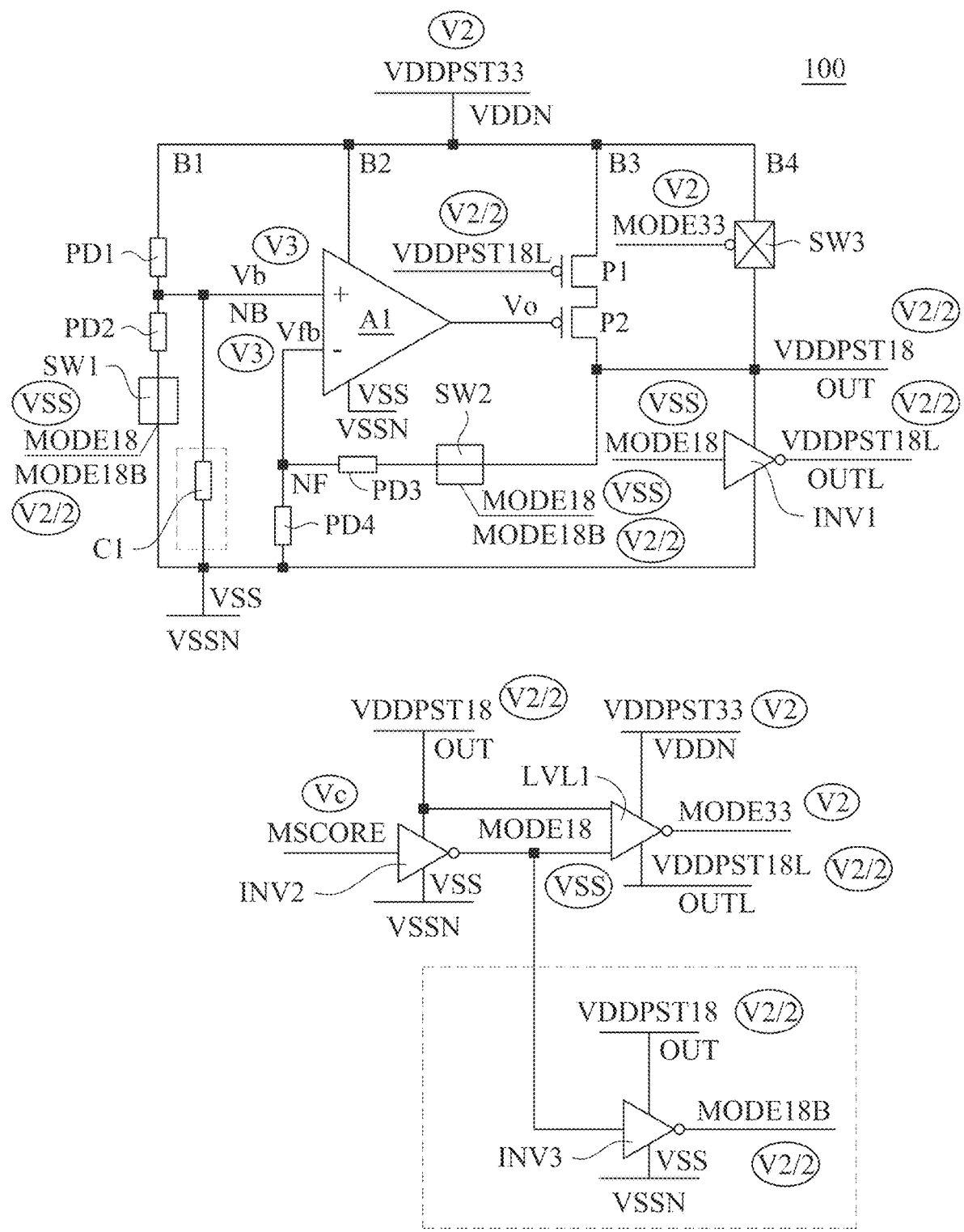

FIGS. 1A-1C are schematic diagrams of a dual mode circuit 100, in accordance with some embodiments. Dual mode circuit 100, also referred to as mid-bias supply circuit 100 in some embodiments, is an IC configured to operate in each of two operational modes as discussed below. The configuration of dual mode circuit 100 is discussed below with respect to FIG. 1A, the first and second operational modes are discussed below with respect to FIGS. 1B and 1C, respectively, and a power-up sequence corresponding to the first operational mode is discussed below with respect to FIG. 2.

Dual mode circuit 100 includes a reference node VSSN configured to receive a reference voltage VSS having a reference voltage level, e.g., a ground voltage level, also referred to as reference voltage level VSS, and a power supply node VDDN configured to receive a power supply voltage VDDPST33. Power supply voltage VDDPST33 is configured to have one of a first voltage level or a second voltage level greater than the first voltage level. In each of the first operational mode corresponding to the first voltage level and the second operational mode corresponding to the second voltage level, dual mode circuit 100 is configured to generate an output voltage VDDPST18 on an output node OUT and an output voltage VDDPST18L on an output node OUTL.

A power portion of dual mode circuit 100 includes branches B1-B4 extending from power supply node VDDN to reference node VSSN. Branch B1 includes first and second passive devices PD1 and PD2 and a switching device SW1 coupled in series; branch B2 includes an amplifier A1; branch B3 includes transistors P1 and P2, output node OUT, a switching device SW2, and passive devices PD3 and PD4 coupled in series; and branch B4 includes a switching device SW3, output node OUT, and an inverter INV1 coupled in series. In various embodiments, one or more of branches B1-B4 includes one or more circuit elements in addition to those depicted in FIGS. 1A-1C, e.g., a switching device, and/or dual mode circuit 100 includes one or more branches, e.g., an electrostatic discharge (ESD) branch, in addition to branches B1-B4 depicted in FIGS. 1A-1C.

A passive device, e.g., a passive device PD1-PD4, is a two-terminal circuit component including one or more IC structures, e.g., a resistor or diode, configured to generate a predetermined voltage drop responsive to an applied current and/or conduct a predetermined current level responsive to an applied voltage in operation. In various embodiments, a passive device is one or more of passive devices 300A-300D discussed below with respect to FIGS. 3A-3D.

A switching device, e.g., a switching device SW1-SW3, is an active circuit component including one or more IC structures, e.g., a transistor, configured to selectively couple and decouple two terminals responsive to one or more control signals, thereby providing a low resistance path in a switched on state and high resistance path in a switched off state, in operation. In various embodiments, a switching device is one of switching devices 400A-400D discussed below with respect to FIGS. 4A-4D.

Two or more circuit elements are considered to be coupled based on one or more direct signal connections and/or one or more indirect signal connections that include one or more resistive elements and/or one or more logic devices, e.g., an inverter or logic gate, between the two or more circuit elements. In some embodiments, signal communications between the two or more coupled circuit elements are capable of being modified, e.g., inverted or made conditional, by the one or more logic devices.

In branch B1, the series configuration of passive devices PD1 and PD2 and switching device SW1 includes a bias node NB positioned between passive devices PD1 and PD2, and switching device SW1 positioned between bias node NB and reference node VSSN. Passive devices PD1 and PD2 and switching device SW1 are thereby arranged as a configurable voltage divider capable of generating a bias voltage Vb on bias node NB, in operation. In some embodiments, switching device SW1 is referred to as bias voltage enable circuit SW1.

Switching device SW1 includes one or more input terminals (not labeled) configured to receive one or both of signals MODE18 or MODE18B, further discussed below, and is thereby configured to be switched on and off responsive to the one or both of signals MODE18 or MODE18B, in operation. In some embodiments, switching device SW1 is one of switching devices 400A-400D discussed below with respect to FIGS. 4A-4D.

In the first operational mode, switching device SW1 is configured to be switched off such that bias node NB is decoupled from reference node VSSN, and bias voltage Vb follows power supply voltage VDDPST33 on power supply node VDDN through passive device PD1, as further discussed below with respect to FIG. 1B. In the second operational mode, switching device SW1 is configured to be switched on such that bias node NB is coupled to reference node VSSN through passive device PD2, and bias voltage Vb has a value of power supply voltage VDDPST33 divided by the voltage divider of passive devices PD1 and PD2, as further discussed below with respect to FIG. 1C.

In the embodiment depicted in FIGS. 1A-1C, switching device SW1 is positioned between passive device PD2 and reference node VSSN. In some embodiments, switching device SW1 is positioned between bias node NB and passive device PD2.

In some embodiments, dual mode circuit 100 includes a capacitive device C1 coupled between bias node NB and reference node VSSN, capacitive device C1 thereby being configured in parallel with passive device PD2 and switching device SW1.

A capacitive device, e.g., capacitive device C1, is a two-terminal circuit component including one or more IC structures, e.g., a capacitor, configured to have a predetermined capacitance level between the two terminals. In various embodiments, a capacitive device is one of capacitive devices 500A-500C discussed below with respect to FIGS. 5A-5C.

In operation, capacitive device C1, if present, acts to stabilize bias voltage Vb on bias node NB, e.g., by attenuating one or more alternating current (AC) noise signals through a low impedance path between bias node NB and reference node VSSN.

In branch B2, amplifier A1 is an electronic circuit including a plurality of IC structures, e.g., transistors, configured to generate a voltage Vo having magnitude and polarity based on a difference between a voltage at a non-inverting input terminal and a voltage at an inverting input terminal. Amplifier A1 includes power input terminals (not labeled) coupled to power supply node VDDN and reference node VSSN, and is thereby configured to operate in the voltage domain of power supply voltage VDDPST33.

In the embodiment depicted in FIGS. 1A-1C, the non-inverting input terminal is coupled to bias node NB and the inverting input terminal is coupled to a feedback node NF configured to have a feedback voltage Vfb; amplifier A1 is thereby configured to generate voltage Vo based on a difference between bias voltage Vb and feedback voltage Vfb. In some embodiments, amplifier A1 is otherwise configured, e.g., by the non-inverting input terminal being coupled to feedback node NF and the inverting input terminal being coupled to bias node NB, to generate voltage Vo based on the difference between bias voltage Vb and feedback voltage Vfb.

In branch B3, the series configuration of transistors P1 and P2, output node OUT, passive devices PD3 and PD4, and switching device SW2 includes transistors P1 and P2 coupled in series between power supply node VDDN and output node OUT. A gate of transistor P1 is configured to receive output voltage VDDPST18L, and a gate of transistor P2 is configured to receive voltage Vo. In some embodiments, the gate of transistor P1 is configured to receive signal MODE18B instead of voltage VDDPST18L.

In the embodiment depicted in FIGS. 1A-1C, each of transistors P1 and P2 is a p-type transistor, and transistors P1 and P2 are thereby configured to selectively couple output node OUT to power supply node VDDN responsive to output voltage VDDPST18L and voltage Vo. In various embodiments, one or both of transistors P1 or P2 is an n-type transistor, and transistors P1 and P2 are otherwise configured to selectively couple output node OUT to power supply node VDDN responsive to output voltage VDDPST18L and voltage Vo.

Switching device SW2 and passive device PD3 are coupled in series between output node OUT and feedback node NF, and passive device PD4 is coupled between feedback node NF and reference node VSSN. Passive devices PD3 and PD4 and switching device SW2 are thereby arranged as a configurable voltage divider capable of generating feedback voltage Vfb on feedback node NF, in operation. In some embodiments, switching device SW2 is referred to as feedback voltage enable circuit SW2.

Switching device SW2 includes one or more input terminals (not labeled) configured to receive one or both of signals MODE18 or MODE18B, and is thereby configured to be switched on and off responsive to the one or both of signals MODE18 or MODE18B, in operation. In some embodiments, switching device SW2 is one of switching devices 400A-400D discussed below with respect to FIGS. 4A-4D.

In the first operational mode, switching device SW2 is configured to be switched off such that output node OUT is decoupled from reference node VSSN, and feedback voltage Vfb follows reference voltage VSS on reference node VSSN through passive device PD4, as further discussed below with respect to FIG. 1B. In the second operational mode, switching device SW2 is configured to be switched on such that feedback node NF is coupled to output node OUT through passive device PD3, and feedback voltage Vfb has a value of output voltage VDDPST18 divided by the voltage divider of passive devices PD3 and PD4, as further discussed below with respect to FIG. 1C.

In the embodiment depicted in FIGS. 1A-1C, switching device SW2 is positioned between output node OUT and passive device PD3. In some embodiments, switching device SW2 is positioned between passive device PD3 and feedback node NF.

In branch B4, the series configuration of switching device SW3, output node OUT, and inverter INV1 includes switching device SW3 coupled between power supply node VDDN and output node OUT, and inverter INV1 coupled between output node OUT and reference node VSSN.

Switching device SW3 includes an input terminal (not labeled) configured to receive signal MODE33, further discussed below, and is thereby configured to be switched on and off responsive to signal MODE33, in operation. In some embodiments, switching device SW3 is one of switching devices 400A-400D discussed below with respect to FIGS. 4A-4D.

In the first operational mode, switching device SW3 is configured to be switched on such that output node OUT is coupled to power supply node VDDN, and output voltage VDDPST18 follows power supply voltage VDDPST33 on power supply node VDDN through switching device SW3, as further discussed below with respect to FIG. 1B. In the second operational mode, switching device SW3 is configured to be switched off such that output node OUT is not coupled to power supply node VDDN through switching device SW3, and output voltage VDDPST18 on output node OUT is controlled by branches B1-B3 of dual mode circuit 100, as further discussed below with respect to FIG. 1C. In some embodiments, branches B1-B3 configured in accordance with the second operational mode are referred to collectively as a low-dropout regulator.

An inverter, e.g., inverter INV1, is an electronic device including a plurality of IC structures, e.g., transistors, configured to generate an output signal complementary to an input signal, and having logically high and low voltage levels corresponding to voltage levels at corresponding power input terminals. An inverter is thereby configured to operate in a voltage domain of the voltage levels at the power input terminals.

In some embodiments, an inverter, e.g., inverter INV1, includes the plurality of IC structures capable of sourcing a current sufficiently large that the inverter is capable of generating the output signal usable as a stable power source, the output signal in such embodiments also being referred to as an output voltage. In some embodiments, an inverter configured to generate an output voltage includes larger and/or a greater number of transistors than an inverter configured to generate an output signal, the size and number of transistors corresponding to a total channel size. In some embodiments, an inverter configured to generate an output voltage has a total channel size more than 200 times greater than a total channel size of an inverter configured to generate an output signal. Because parasitic gate capacitance increases with increasing total channel size, inverter switching speed decreases as total channel size increases, in some embodiments.

Table 1 is a non-limiting example of total channel sizes for a first inverter embodiment corresponding to output signal generation and a second inverter embodiment corresponding to output voltage generation. For each inverter type, each p-type and n-type transistor has a channel width in nanometers (nm) and a channel length (in nm), and the inverter includes a number of transistor instances of each type equal to a multiple. A total channel size (in $nm^2$) is thereby given by two times (p-type plus n-type) the channel width multiplied by the multiple. In the example depicted in Table 1, the inverter configured to generate an output voltage has the total channel size equal to 205 times the total channel size of the inverter configured to generate an output signal.

TABLE 1

Inverter Channel Size Example

| Output Type | Width | Length | Multiple | Channel Size |
|---|---|---|---|---|
| Signal | 338 | 135 | 4 | 2,704 |
| Voltage | 578 | 135 | 480 | 554,880 |

Inverter INV1 includes an input terminal (not labeled) configured to receive signal MODE18, and power input terminals (not labeled) coupled to output node OUT and reference node VSSN, and is thereby configured to generate output voltage VDDPST18L complementary to signal MODE18 by operating in the voltage domain of output voltage VDDPST18.

The signal portion of dual mode circuit 100 includes an inverter INV2 coupled between output node OUT and reference node VSSN, a level shifter LVL1 coupled between power supply node VDDN and output node OUTL, and an inverter INV3 coupled between output node OUT and reference node VSSN. Input and output terminals of inverters INV2 and INV3 and level shifter LVL1 are not labeled for the purpose of clarity.

A level shifter, e.g., level shifter LVL1, is an electronic device including a plurality of IC structures, e.g., transistors, configured to generate an output signal complementary to an input signal received at a first input terminal and enabled by a control signal received at a second input terminal. The output signal has logically high and low voltage levels corresponding to voltage levels at corresponding power input terminals, and the logically high voltage level of the output signal is capable of being greater than a logically high voltage level of the input signal. A level shifter is thereby configured to operate in a voltage domain of the voltage levels at the power input terminals.

Inverter INV2 includes an input terminal configured to receive a signal MSCORE; level shifter LVL1 includes a first input terminal coupled to an output terminal of inverter INV1, and a second input terminal coupled to output node OUT; and inverter INV3 includes an input terminal coupled to the output terminal of inverter INV2.

Signal MSCORE, also referred to as mode select signal MSCORE in some embodiments, is a signal received from a circuit (not shown) external to dual mode circuit 100 and is configured to have a logically low voltage level, e.g., reference voltage level VSS, corresponding to the first operational mode of dual mode circuit 100, and a logically high voltage level, e.g., a core voltage level Vc discussed below, corresponding to the second operational mode of dual mode circuit 100. In some embodiments, dual mode circuit 100 is included in an I/O, or interface, portion of an IC, and signal MSCORE is received from a core portion of the IC.

In some embodiments, the logically high voltage level of signal MSCORE has a value less than the first voltage level of power supply voltage VDDPST33. In some embodiments, the logically high voltage level of signal MSCORE has a value less than half of the first voltage level of power supply voltage VDDPST33. In some embodiments, the logically high voltage level of signal MSCORE has a value ranging from 0.5 volts (V) to 1.0 V. Decreasing values of the logically high voltage level of signal MSCORE correspond to decreasing power consumption levels of the source of signal MSCORE, e.g., a core portion of an IC.

Inverter INV2 is configured to generate signal MODE18, also referred to as mode control signal MODE18 in some embodiments, complementary to signal MSCORE. Signal MODE18 has a logically high voltage level corresponding to a voltage level of output voltage VDDPST18 and a logically low voltage level corresponding to reference voltage level VSS.

Level shifter LVL1 is configured to generate signal MODE33, also referred to as mode control signal MODE33 in some embodiments, complementary to signal MODE18. Signal MODE33 has a logically high voltage level corresponding to the voltage level of power supply voltage VDDPST33 and a logically low voltage level corresponding to a voltage level of output voltage VDDPST18L.

Level shifter LVL1 is configured to selectively generate signal MODE33 based on the voltage level of output voltage VDDPST18 such that level shifter LVL1 is enabled by output voltage VDDPST18 having a logically high voltage level and disabled by output voltage VDDPST18 having a logically low voltage level.

Inverter INV3 is configured to generate signal MODE18B, also referred to as mode control signal MODE18B in some embodiments, complementary to signal MODE18. Signal MODE18B has the logically high voltage level corresponding to a voltage level of output voltage VDDPST18 and the logically low voltage level corresponding to reference voltage level VSS.

In some embodiments, inverter INV3 includes transistors having a total channel size less than a total channel size of transistors included in inverter INV1, and inverter INV3 is thereby configured to have a switching speed greater than that of inverter INV1. In some embodiments, inverter INV1 includes transistors having a total channel size more than 200 times greater than the total channel size of inverter INV3.

In some embodiments, dual mode circuit 100 does not include inverter INV3 configured to generate signal MODE18B, and one or both of switching devices SW1 or SW2 is configured to receive voltage VDDPST18L generated by inverter INV1.

By the configuration discussed above, dual mode circuit 100 is capable of steady-state operation in the first operational mode illustrated in FIG. 1B in which power supply voltage VDDPST33 has a first voltage level V1 corresponding to an operating voltage range of the included IC structures, and steady-state operation in the second operational mode illustrated in FIG. 1C in which power supply voltage VDDPST33 has a second voltage level V2 greater than the first voltage level.

In various embodiments, first voltage level V1 and second voltage level V2 correspond to operating voltage levels of one or more circuits (not shown), e.g., external to dual mode circuit 100, such that one or both of the first or second operational modes is configured to provide compatibility between dual mode circuit 100 and the one or more circuits. In some embodiments, one or both of first voltage level V1 or second voltage level V2 corresponds to SD card or RGMII operation.

In some embodiments, power supply voltage VDDPST33 has first voltage level V1 ranging from 1.0 V to 2.0 V. In some embodiments, power supply voltage VDDPST33 has first voltage level V1 ranging from 1.5 V to 1.8 V.

In some embodiments, power supply voltage VDDPST33 has second voltage level V2 ranging from 2.5 V to 4.0 V. In some embodiments, power supply voltage VDDPST33 has second voltage level V2 ranging from 3.0 V to 3.3 V.

In the embodiment depicted in FIGS. 1B and 1C, each of switching devices SW1 and SW2 is configured to receive each of signals MODE18 and MODE18B, and is thereby configured to be switched on and off responsive to signals MODE18 and/or MODE18B. In various embodiments, one or both of switching devices SW1 or SW2 is configured to receive a single one of signals MODE18 or MODE18B and is thereby configured to be switched on and off responsive to the one of signals MODE18 or MODE18B.

In some embodiments, switching device SW1 includes an n-type transistor, e.g., a transistor N2 of switching device 400B discussed below with respect to FIG. 4B, and is thereby configured to be switched on and off responsive to signal MODE18B.

In some embodiments, switching device SW2 includes a transmission gate, e.g., a transmission gate TG1 of switching device 400A discussed below with respect to FIG. 4A, and is thereby configured to be switched on and off responsive to signals MODE18 and MODE18B.

In some embodiments, switching device SW3 includes a plurality of p-type transistors, e.g., transistors P5 and P6 of switching device 400D discussed below with respect to FIG. 4D, and is thereby configured to be switched on and off responsive to signal MODE33.

In the steady-state operation of the first operational mode depicted in FIG. 1B, each of power supply voltage VDDPST33 on power supply node VDDN and output voltage VDDPST18 generated on output node OUT has first voltage level V1, as discussed below.

Based on signal MSCORE having reference voltage level VSS, inverter INV2 generates signal MODE18 having first voltage level V1, and inverter INV3 generates signal MODE18B having reference voltage level VSS. Based on one or both of signal MODE18 having voltage level V1 or signal MODE18B having reference voltage level VSS, each of switching devices SW1 and SW2 is switched off.

Based on signal MODE18 having voltage level V1, level shifter LVL1 generates signal MODE33 having reference voltage level VSS, thereby switching on switching device SW3, and inverter INV1 generates output voltage VDDPST18L having reference voltage level VSS, thereby switching on transistor P1.

Branch B1 is thereby configured to generate bias voltage Vb having first voltage level V1 at the non-inverting input of amplifier A1, and branch B3 is thereby configured to generate feedback voltage Vfb having reference voltage level VSS at the inverting input of amplifier A1. Based on first voltage level V1 being greater than reference voltage level VSS, amplifier A1 generates voltage Vo having first voltage level V1, thereby switching off transistor P2.

Based on output node OUT being decoupled from power supply node VDDN by transistor P2, decoupled from reference node VSSN by switching device SW2, and coupled to power supply node VDDN through switching device SW3, output node OUT has first voltage level V1.

In the steady-state operation of the second operational mode depicted in FIG. 1C, power supply voltage VDDPST33 on power supply node VDDN has second voltage level V2, and output voltage VDDPST18 generated on output node OUT has a voltage level V2/2 equal to half of second voltage level V2, as discussed below.

Based on signal MSCORE having core voltage level Vc, inverter INV2 generates signal MODE18 having reference voltage level VSS, and inverter INV3 generates signal MODE18B having voltage level V2/2. Based on one or both of signal MODE18 having reference voltage level VSS or signal MODE18B having voltage level V2/2, each of switching devices SW1 and SW2 is switched on.

Based on signal MODE18 having reference voltage level VSS, level shifter LVL1 generates signal MODE33 having second voltage level V2, thereby switching off switching device SW3, and inverter INV1 generates output voltage VDDPST18L having voltage level V2/2, thereby switching on transistor P1. Voltage level V2/2 has a value relative to second voltage level V2 such that a difference between second voltage level V2 and voltage level V2/2 is less than a maximum specified operating voltage of transistor P1.

Based on relative voltage drops across passive devices PD1 and PD2, branch B1 is configured to generate bias voltage Vb having a voltage V3 at the non-inverting input of amplifier A1. Amplifier A1 generates voltage Vo so as to control current flow through transistor P2 such that relative voltage drops across passive devices PD3 and PD4 generate feedback voltage Vfb having voltage level V3 at the inverting input of amplifier A1.

Dual mode circuit 100 includes passive devices PD1-PD4 configured to generate each of bias voltage Vb and feedback voltage Vfb having voltage level V3 equal to a predetermined fraction of voltage level V2/2. In some embodiments, dual mode circuit 100 includes passive devices PD1-PD4 configured to generate each of bias voltage Vb and feedback voltage Vfb having voltage level V3 equal to a fraction of voltage level V2/2 ranging from 0.4 to 0.6. In some embodiments, dual mode circuit 100 includes passive devices PD1-PD4 configured to generate each of bias voltage Vb and feedback voltage Vfb having voltage level V3 ranging from 0.9 V to 1.1 V.

Dual mode circuit 100 thereby includes passive devices PD1-PD4 configured to generate each of bias voltage Vb and feedback voltage Vfb having voltage level V3 at the inputs of amplifier A1 such that each of output voltage VDDPST18 and VDDPST18L has voltage level V2/2.

By the configuration discussed above, dual mode circuit 100 is capable of generating output voltage VDDPST18 having first voltage level V1 in the first operational mode and voltage level V2/2 in the second operational mode, each of which corresponds to an operating voltage range of the IC structures included in dual mode circuit 100. In the first operational mode, because switching devices SW1 and SW2 are switched off, dual mode circuit 100 generates output voltage VDDPST18 with a significantly reduced standby leakage current compared to approaches that do not include switching devices in bias and feedback voltage paths. In some embodiments, dual mode circuit 100 operates in the first operational mode with standby current reduced by greater than 98% compared to approaches that do not include switching devices in bias and feedback voltage paths.

As discussed below with respect to FIG. 2, by the configuration discussed above, dual mode circuit 100 is further capable of powering up in the first operational mode by coupling output node OUT to power supply node VDDN before amplifier A1 is otherwise capable of controlling output node OUT such that power-up reliability is improved compared to approaches that do not include switching devices in bias and feedback voltage paths.

Figure 2:
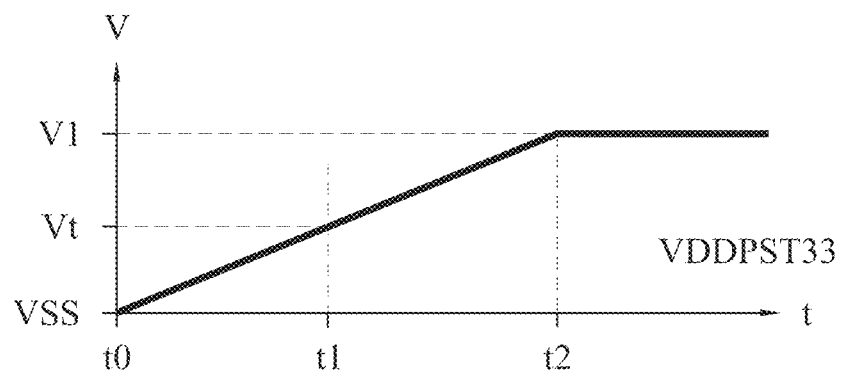
FIG. 2 is a diagram of dual mode circuit operating parameters, in accordance with some embodiments.
Figure 2:
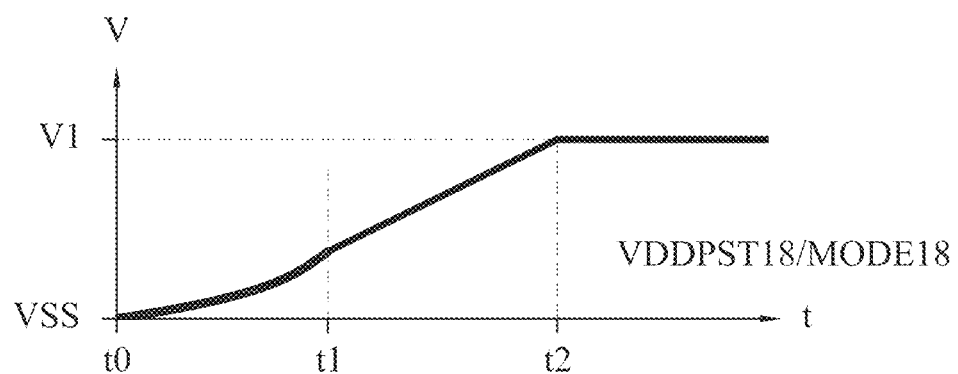
Figure 2:
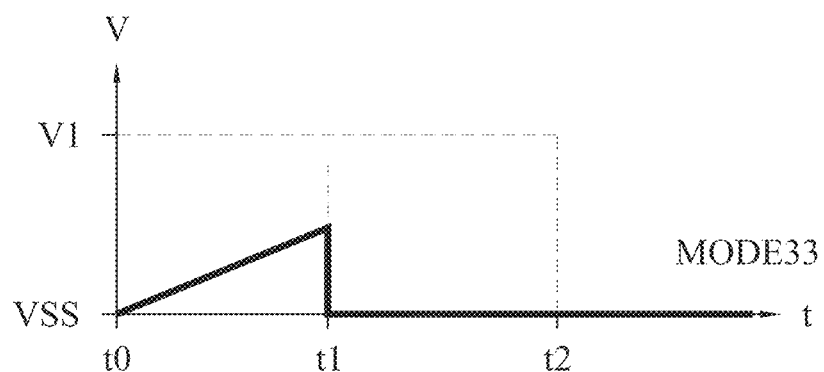
Figure 3A:
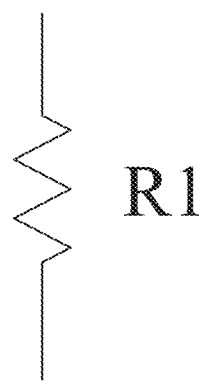
FIGS. 3A-3D are schematic diagrams of passive devices, in accordance with some embodiments.
Figure 3B:
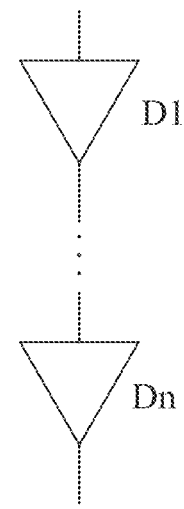
Figure 3C:
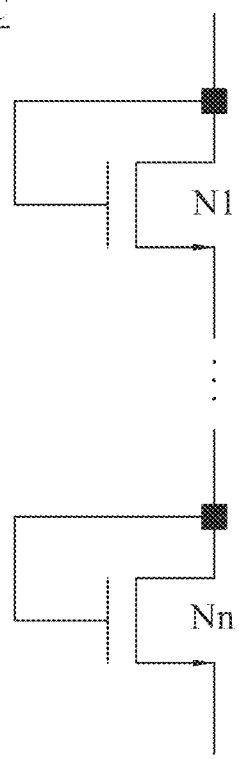
Figure 3D:
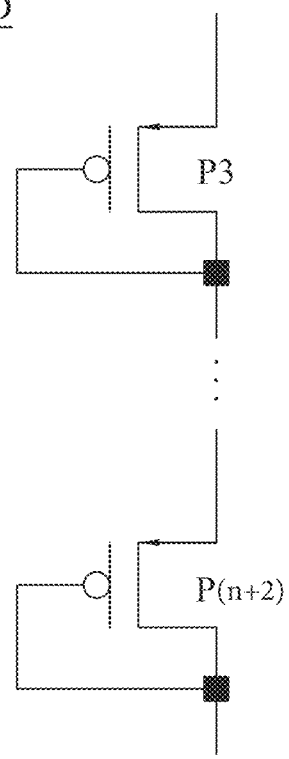

FIG. 2 is a diagram of dual mode circuit 100 operating parameters, in accordance with some embodiments. In some embodiments, the operating parameters depicted in FIG. 2 are referred to as a power-up sequence. FIG. 2 illustrates a non-limiting example including time plotted on the x-axis and voltage plotted on the y-axis for each of power supply voltage VDDPST33, output voltage VDDPST18 (also representing signal MODE18), and signal MODE33.

FIG. 2 depicts three specific times along the x-axis: a time t0 corresponding to initiation of the power-up sequence, an intermediate time t1, and a time t2 corresponding to dual mode circuit 100 reaching steady-state operation in the first operational mode as depicted in FIG. 1C. In accordance with operation in the first operational mode, signal MSCORE (not shown) has the logically low voltage level throughout the power-up sequence.

Each of power supply voltage VDDPST33, output voltage VDDPST18 (signal MODE18), and signal MODE33 is plotted relative to reference voltage level VSS and first voltage level V1 discussed above with respect to FIGS. 1A-1C. Power supply voltage VDDPST33 represents power supply voltage levels received by dual mode circuit 100 at power supply node VDDN.

Prior to time t0, each of power supply voltage VDDPST33, output voltage VDDPST18, and signal MODE33 has reference voltage level VSS corresponding to a powered down state. In the embodiment depicted in FIG. 2, from time t0 to time t2, power supply voltage VDDPST33 ramps linearly from reference voltage level VSS to first voltage level V1, reaching a voltage level Vt at time t1. In some embodiments, power supply voltage VDDPST33 ramps other than linearly from reference voltage level VSS to first voltage level V1, thereby reaching voltage level Vt at time t1.

Voltage level Vt corresponds to a value of power supply voltage VDDPST33 above which level shifter LVL1 becomes enabled so as to generate signal MODE33 based on output voltage VDDPST18 and signal MODE18 as discussed above with respect to FIG. 1B. In some embodiments, voltage level Vt corresponds to a threshold voltage level of one or more transistors included in level shifter LVL1. In some embodiments, voltage level Vt has a value ranging from 0.4 V to 0.7 V.

From time t0 through time t1, transistors P1 and P2 are partially switched on such that output voltage VDDPST18 is pulled up by power supply voltage VDDPST33 on power supply node VDDN while lagging the ramp of power supply voltage VDDPST33. In response to output voltage VDDPST18 and the low logical level of signal MSCORE (not shown) corresponding to the first operational mode, inverter INV2, discussed above with respect to FIG. 1B, generates signal MODE18 following output voltage VDDPST18.

Because power supply voltage VDDPST33 is below voltage level Vt, level shifter LVL1 is not responsive to output voltage VDDPST18 and signal MODE18 and generates signal MODE33 following the ramp of power supply voltage VDDPST33.

At time t1, power supply voltage VDDPST33 crossing voltage level Vt causes level shifter LVL1 to become enabled, thereby generating signal MODE33 having reference voltage level VSS in response to the logically high voltage levels of output voltage VDDPST18 and signal MODE18.

Signal MODE33 having reference voltage level VSS causes switching device SW3 to be switched on, thereby coupling output node OUT to power supply node VDDN such that output voltage VDDPST18 follows power supply voltage VDDPST33 through switching device SW3, with signal MODE18 continuing to follow output voltage VDDPST18.

Accordingly, from time t1 to time t2, each of power supply voltage VDDPST33, output voltage VDDPST18, and signal MODE18 ramps up to first voltage level V1 while signal MODE33 remains at reference voltage level VSS, and dual mode circuit 100 reaches steady-state operation.

From time t0 to time t2, signal MODE18 following output voltage VDDPST18 causes inverter INV3, discussed above with respect to FIG. 1B, to generate signal MODE18B having reference voltage level VSS, thereby switching off each of switching devices SW1 and SW2. Switching device SW1 being switched off decouples bias node NB, and thereby the non-inverting input terminal of amplifier A1, from reference node VSSN, and switching device SW2 being switched off decouples output node OUT from feedback node NF, and thereby from the inverting input terminal of amplifier A1.

Decoupling the input terminals of amplifier A1 from each of reference node VSSN and output node OUT causes output voltage VDDPST18 and signal MODE18 to ramp up more quickly than in approaches in which switching devices are not used to decouple amplifier input terminals from corresponding nodes. The increased rate at which output voltage VDDPST18 and signal MODE18 are ramped up causes switching device SW3 to be switched on, thereby coupling output node OUT to power supply node VDDN, before amplifier A1 otherwise controls output node OUT through transistor P2, e.g., by decoupling output node OUT from power supply node VDDN. Accordingly, output voltage VDDPST18 is ramped to first voltage level V1 more reliably than in approaches in which switching devices are not used to decouple amplifier input terminals from corresponding nodes.

FIGS. 3A-3D are schematic diagrams of respective passive devices 300A-300D, in accordance with some embodiments. Each of passive devices 300A-300D is usable as some or all of passive devices PD1-PD4 discussed above with respect to FIGS. 1A-2. Each of passive devices 300A-300D includes two terminals that are not labeled for the purpose of clarity.

Passive device 300A incudes a resistive device R1, e.g., a resistor or plurality of resistors, coupled between the two terminals and is thereby configured to have a predetermined resistance value such that, in operation, application of a given current level through resistive device R1 generates a predetermined voltage drop between the two terminals and/or application of a given voltage level across the two terminals generates a predetermined current level through resistive device R1.

Passive device 300B includes a number n of diodes D1-Dn coupled in series between the two terminals; passive device 300C includes the number n of diode-configured n-type transistors N1-Nn coupled in series between the two terminals; and passive device 300D includes the number n of diode-configured p-type transistors P3-P(n+2) coupled in series between the two terminals. In various embodiments, one or more of passive devices 300B-300D includes the number n ranging from 1 to 3. In some embodiments, one or more of passive devices 300B-300D includes the number n greater than 3.

Each of passive devices 300B-300D is thereby configured to, in operation, have a predetermined voltage drop between the two terminals in response to application of a given current level and/or conduct a predetermined current level in response to application of a given voltage level across the two terminals.

By including one or more of passive devices 300A-300D as some or all of one or more of passive devices PD1-PD4, a dual mode circuit is capable of realizing the benefits discussed above with respect to dual mode circuit 100.

FIGS. 4A-4D are schematic diagrams of respective switching devices 400A-400D, in accordance with some embodiments. Each of switching devices 400A-400D is usable as one of switching devices SW1-SW3 discussed above with respect to FIGS. 1A-2. Each of switching devices 400A-400D includes two terminals that are not labeled for the purpose of clarity.

Switching device 400A incudes a transmission gate TG1 coupled between the two terminals, the transmission gate including two gates configured to receive complementary control signals, e.g., signals MODE18 and MODE18B discussed above with respect to FIGS. 1A-2. Switching device 400A is thereby configured to, in operation, provide a low resistance path between the two terminals in response to the complementary signals having a first pair of logical levels, and provide a high resistance path between the two terminals in response to the complementary signals having an opposite pair of logical levels.

Switching device 400B incudes an n-type transistor N2 coupled between the two terminals, transistor N2 including a gate configured to receive a control signal, e.g., signal MODE18B discussed above with respect to FIGS. 1A-2. Switching device 400B is thereby configured to, in operation, provide a low resistance path between the two terminals in response to the control signal having the logically high level, and provide a high resistance path between the two terminals in response to the control signal having the logically low level.

Switching device 400C incudes a p-type transistor P4 coupled between the two terminals, transistor P4 including a gate configured to receive a control signal, e.g., signal MODE18 discussed above with respect to FIGS. 1A-2. Switching device 400C is thereby configured to, in operation, provide a low resistance path between the two terminals in response to the control signal having the logically low level, and provide a high resistance path between the two terminals in response to the control signal having the logically high level.

Switching device 400D incudes p-type transistors P5 and P6 coupled in series between the two terminals, each of transistors P5 and P6 including a gate configured to receive a control signal, e.g., signal MODE33 discussed above with respect to FIGS. 1A-2. Switching device 400D is thereby configured to, in operation, provide a low resistance path between the two terminals in response to the control signal having the logically low level, and provide a high resistance path between the two terminals in response to the control signal having the logically high level.

By including one or more of switching devices 400A-400D as one or more of switching devices SW1-SW3, a dual mode circuit is capable of realizing the benefits discussed above with respect to dual mode circuit 100.

Figure 5A:
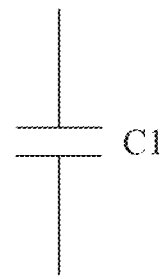
FIGS. 5A-5C are schematic diagrams of capacitive devices, in accordance with some embodiments.
Figure 5B:
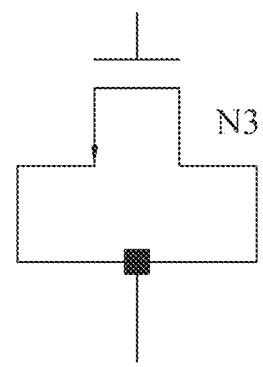
Figure 5C:
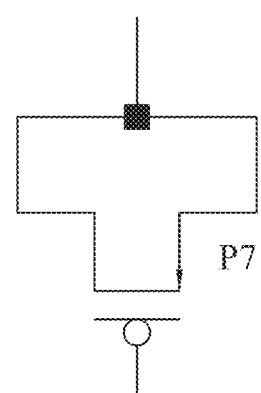

FIGS. 5A-5C are schematic diagrams of respective capacitive devices 500A-500C, in accordance with some embodiments. Each of capacitive devices 500A-500C is usable as capacitive device C1 discussed above with respect to FIGS. 1A-2. Each of capacitive devices 500A-500C includes two terminals that are not labeled for the purpose of clarity.

Capacitive device 500A incudes a capacitor C1 coupled between the two terminals. Capacitor C1 is an IC structure including two or more electrodes separated by corresponding dielectric layers, and is thereby configured to provide a predetermined capacitance level between the two terminals in operation.

Capacitive device 500B incudes an n-type transistor N3 having a gate coupled to one of the two terminals and source/drain terminals coupled to each other and to the other of the two terminals. Capacitive device 500B is thereby configured to provide a predetermined capacitance level between the two terminals in operation.

Capacitive device 500C incudes a p-type transistor P7 having a gate coupled to one of the two terminals and source/drain terminals coupled to each other and to the other of the two terminals. Capacitive device 500C is thereby configured to provide a predetermined capacitance level between the two terminals in operation.

By including one or more of capacitive devices 500A-500C as capacitive device C1, a dual mode circuit is capable of realizing the benefits discussed above with respect to dual mode circuit 100.

FIG. 6 is a flowchart of a method 600 of operating dual mode circuit, in accordance with one or more embodiments. Method 600 is usable with a dual mode circuit, e.g., dual mode circuit 100 discussed above with respect to FIGS. 1A-5C.

The sequence in which the operations of method 600 are depicted in FIG. 6 is for illustration only; the operations of method 600 are capable of being executed in sequences that differ from that depicted in FIG. 6. In some embodiments, operations in addition to those depicted in FIG. 6 are performed before, between, during, and/or after the operations depicted in FIG. 6. In some embodiments, the operations of method 600 are part of operating a circuit, e.g., an SD or RGMII circuit.

At operation 610, in some embodiments, a power supply voltage is received at a power supply node. In some embodiments, receiving the power supply voltage includes receiving the power supply voltage corresponding to an SD or RGMII circuit. In some embodiments, receiving the power supply voltage at the power supply node includes receiving power supply voltage VDDPST33 at power supply node VDDN discussed above with respect to FIGS. 1A-2.

In some embodiments, receiving the power supply voltage at the power supply node includes receiving a reference voltage having a reference voltage level at a reference node. In some embodiments, receiving the reference voltage at the reference node includes receiving reference voltage VSS having reference voltage level VSS at reference node VSSN discussed above with respect to FIGS. 1A-2.

In some embodiments, receiving the power supply voltage at the power supply node includes the power supply voltage ramping to a voltage level from the reference voltage level. In some embodiments, the power supply voltage ramping to the voltage level from the reference voltage level includes power supply voltage VDDPST33 ramping to one of the first voltage level, e.g., first voltage level V1, or the second voltage level, e.g., second voltage level V2, from reference voltage level VSS as discussed above with respect to FIGS. 1A-2.

At operation 620, a mode select signal is received having a first logical level indicative of the power supply voltage having a first voltage level, and a first mode control signal is generated having a second logical level complementary to the first logical level. The mode select signal is received at a first inverter, and the first inverter is used to generate the first mode control signal in response to the mode select signal having the first logical level. In some embodiments, the first logical level is a logically low level and the second logical level is a logically high level.

In some embodiments, receiving the mode select signal includes receiving the mode select signal from a core portion of an IC. In some embodiments, receiving the mode select signal includes receiving signal MSCORE discussed above with respect to FIGS. 1A-2.

In some embodiments, receiving the mode select signal having the first logical level indicative of the power supply voltage having the first voltage level includes the power supply voltage ramping from the reference voltage level to the first voltage level. In some embodiments, the first logical level being indicative of the power supply voltage having the first voltage level includes power supply voltage VDDPST33 having the first voltage level, e.g., first voltage level V1, as discussed above with respect to FIGS. 1A-2.

In some embodiments, receiving the mode select signal at the first inverter and using the first inverter to generate the first mode control signal in response to the mode select signal having the first logical level includes using inverter INV2 to generate signal MODE18 as discussed above with respect to FIGS. 1A-2.

In some embodiments, using the first inverter to generate the first mode control signal includes using a second inverter to generate a second mode control signal from the first mode control signal, the second mode control signal having the first logical level. In some embodiments, using the second inverter to generate the second mode control signal from the first mode control signal includes using inverter INV3 to generate signal MODE18B from signal MODE18 as discussed above with respect to FIGS. 1A-2. In some embodiments, using the second inverter to generate the second mode control signal from the first mode control signal includes using inverter INV1 to generate voltage VDDPST18L from signal MODE18 as discussed above with respect to FIGS. 1A-2.

At operation 630, in response to the first mode control signal having the second logical level, a first switching device is used to decouple a bias path from a reference node, a second switching device is used to decouple a feedback path from an output node, and a third switching device is used to couple the output node to the power supply node. The bias path is coupled to a first input terminal of an amplifier configured to control an output voltage on the output node, and the feedback path is coupled to a second input terminal of the amplifier.

Using the first switching device to decouple the bias path from the reference node includes using the first switching device to decouple a passive device of a first voltage divider from one of a bias node coupled to the first input terminal of the amplifier or the reference node. In some embodiments, using the first switching device to decouple the bias path from the reference node includes using switching device SW1 to decouple passive device PD2 from one of bias node NB or reference node VSSN as discussed above with respect to FIGS. 1A-2.

Using the second switching device to decouple the feedback path from the output node includes using the second switching device to decouple a passive device of a second voltage divider from one of the output node or a feedback node coupled to the second input terminal of the amplifier. In some embodiments, using the second switching device to decouple the feedback path from the output node includes using switching device SW2 to decouple passive device PD3 from one of output node OUT or feedback node NF as discussed above with respect to FIGS. 1A-2.

In some embodiments, one or both of using the first switching device to decouple the bias path from the reference node or using the second switching device to decouple the feedback path from the output node in response to the first mode control signal having the second logical level includes responding to the second mode control signal having the first logical level. In some embodiments, responding to the second mode control signal having the first logical level includes responding to signal MODE18B having reference voltage level VSS as discussed above with respect to FIGS. 1A-2. In some embodiments, responding to the second mode control signal having the first logical level includes responding to voltage VDDPST18L having reference voltage level VSS as discussed above with respect to FIGS. 1A-2.

Using the third switching device to couple the output node to the power supply node includes using the third switching device to provide a low resistance path between the output and power supply nodes. In some embodiments, using the third switching device to provide the low resistance path between the output and power supply nodes includes using switching device SW3 to couple output node OUT to power supply node VDDN as discussed above with respect to FIGS. 1A-2.

In some embodiments, using the third switching device to couple the output node to the power supply node in response to the first mode control signal having the second logical level is in response to a third mode control signal generated from the first mode control signal, the third mode control signal having the first logical level. In some embodiments, using the third switching device to couple the output node to the power supply node in response to the first mode control signal having the second logical level includes using a level shifter to generate the third mode control signal from the first mode control signal. In some embodiments, using the level shifter to generate the third mode control signal from the first mode control signal includes using level shifter LVL1 to generate signal MODE33 having reference voltage level VSS as discussed above with respect to FIGS. 1A-2.

In some embodiments, using the third switching device to couple the output node to the power supply node includes, after coupling the output node to the power supply node, using the amplifier to switch off a transistor coupled between the power supply node and the output node. In some embodiments, using the amplifier to switch off the transistor coupled between the power supply node and the output node includes using amplifier A1 to switch off transistor P2 coupled between power supply node VDDN and output node OUT, as discussed above with respect to FIGS. 1A-2.

At operation 640, in some embodiments, the mode select signal is received having the second logical level indicative of the power supply voltage having a second voltage level greater than the first voltage level. The mode select signal is received at the first inverter as discussed above with respect to operation 620, and the first inverter is used to generate the first mode control signal having the first logical level in response to the mode select signal having the second logical level.

In some embodiments, receiving the mode select signal having the second logical level indicative of the power supply voltage having the second voltage level includes the power supply voltage ramping from the reference voltage level to the second voltage level. In some embodiments, the second logical level being indicative of the power supply voltage having the second voltage level includes power supply voltage VDDPST33 having the second voltage level, e.g., second voltage level V2, as discussed above with respect to FIGS. 1A-2.

In some embodiments, using the first inverter to generate the first mode control signal includes using the second inverter to generate the second mode control signal from the first mode control signal, the second mode control signal having the second logical level, e.g., using inverter INV3 to generate signal MODE18B from signal MODE18 or using inverter INV1 to generate voltage VDDPST18L from signal MODE18, each discussed above with respect to FIGS. 1A-2.

In some embodiments, the mode select signal, e.g., signal MSCORE, having the second logical level includes the mode select signal having a third voltage level, the second mode control signal having the second logical level includes the second mode control signal having a fourth voltage level, e.g., signal MODE18 having voltage level V2/2, greater than the third voltage level and less than the second voltage level, e.g., voltage level V2, as discussed above with respect to FIGS. 1A-1C.

At operation 650, in some embodiments, in response to the first mode control signal having the first logical level, the first switching device is used to couple the bias path to the reference node, the second switching device is used to couple the feedback path to the output node, the third switching device is used to decouple the output node from the power supply node, and the amplifier is used to control the output voltage on the output node.

Using the first switching device to couple the bias path to the reference node includes using the first switching device to couple the passive device of the first voltage divider to the one of the bias node coupled to the first input terminal of the amplifier or the reference node. In some embodiments, using the first switching device to couple the bias path to the reference node includes using switching device SW1 to couple passive device PD2 to one of bias node NB or reference node VSSN as discussed above with respect to FIGS. 1A-2.

Using the first switching device to couple the bias path to the reference node thereby includes using the first voltage divider to generate a bias voltage at the first input terminal of the amplifier based on the second voltage level, e.g., generating bias voltage Vb at the non-inverting input terminal of amplifier A1 based on power supply voltage VDDPST33 having the second voltage level, e.g., second voltage level V2 as discussed above with respect to FIGS. 1A-2.

Using the second switching device to couple the feedback path to the output node includes using the second switching device to couple the passive device of the second voltage divider to the one of the output node or the feedback node coupled to the second input terminal of the amplifier. In some embodiments, using the second switching device to couple the feedback path to the output node includes using switching device SW2 to couple passive device PD3 to one of output node OUT or feedback node NF as discussed above with respect to FIGS. 1A-2.

Using the second switching device to couple the feedback path to the output node thereby includes using the second voltage divider to generate a feedback voltage at the second input terminal of the amplifier based on an output voltage level of the output voltage, e.g., generating feedback voltage Vfb at the inverting input terminal of amplifier A1 based on output voltage VDDPST18, e.g., having voltage level V2/2, as discussed above with respect to FIGS. 1A-2.

In some embodiments, one or both of using the first switching device to couple the bias path to the reference node or using the second switching device to couple the feedback path to the output node in response to the first mode control signal having the first logical level includes responding to the second mode control signal having the second logical level, e.g., responding to signal MODE18B or voltage VDDPST18L having reference voltage level VSS as discussed above with respect to FIGS. 1A-2.

Using the third switching device to decouple the output node from the power supply node includes using the third switching device to provide a high resistance path between the output and power supply nodes, e.g., using switching device SW3 to decouple output node OUT from power supply node VDDN as discussed above with respect to FIGS. 1A-2.

Using the amplifier to control the output voltage on the output node includes generating a control signal based on the bias and feedback voltages, and using the control signal to control a transistor coupled between the power supply node and the output node, e.g., using amplifier A1 to generate voltage Vo based on bias voltage Vb and feedback voltage Vfb, and using voltage Vo to control transistor P2 as discussed above with respect to FIGS. 1A-2.

In some embodiments, using the third switching device to decouple the output node from the power supply node in response to the first mode control signal having the first logical level is in response to the third mode control signal having the second logical level, e.g., by using level shifter LVL1 to generate signal MODE33 having the second voltage level, e.g., second voltage level V2, as discussed above with respect to FIGS. 1A-2.

By executing some or all of the operations of method 600, dual mode circuit operation includes using switching devices to selectively decouple terminals of an amplifier from reference and output nodes during a first operational mode, thereby obtaining the benefits discussed above with respect to dual mode circuit 100.

In some embodiments, a circuit includes a power supply node, a reference node, an output node, an amplifier coupled between the power supply and reference nodes, a first branch extending from the power supply node to the reference node, coupled to a first input terminal of the amplifier, and including a first switching device coupled between the first input terminal and the reference node, a second branch extending from the power supply node to the reference node, coupled to the output node and a second input terminal of the amplifier, and including a second switching device coupled between the output node and the second input terminal, and a third switching device coupled between the power supply and output nodes. The circuit is configured to, responsive to a first voltage level on the power supply node, switch off each of the first and second switching devices and switch on the third switching device, and responsive to a second voltage level on the power supply node greater than the first voltage level, switch on each of the first and second switching devices and switch off the third switching device. In some embodiments, each of the first and second switching devices is configured to receive a first signal, and the first signal is configured to have logically high and low voltage levels corresponding to the respective first and second voltage levels on the power supply node. In some embodiments, the first switching device includes an n-type transistor, and the second switching device includes a transmission gate further configured to receive a second signal complementary to the first signal. In some embodiments, the first branch includes a first resistive device, diode, or diode-configured transistor coupled between the power supply node and the first input terminal of the amplifier; and a second resistive device, diode, or diode-configured transistor coupled between the first input terminal of the amplifier and the first switching device. In some embodiments, one or both of the first or second resistive device, diode, or diode-configured transistor includes a plurality of resistors, diodes, or diode-configured transistors coupled in series. In some embodiments, the second branch includes a first resistive device, diode, or diode-configured transistor coupled between the second switching device and the second input terminal of the amplifier; and a second resistive device, diode, or diode-configured transistor coupled between the second input terminal of the amplifier and the reference node. In some embodiments, one or both of the first or second resistive device, diode, or diode-configured transistor includes a plurality of resistors, diodes, or diode-configured transistors coupled in series. In some embodiments, the second branch includes first and second p-type transistors coupled in series between the power supply node and the output node, the circuit is configured to switch on the first p-type transistor responsive to each of the first and second voltage levels on the power supply node, and the amplifier is configured to switch off the second p-type transistor when the first voltage level is on the power supply node, and control current flow through the second p-type transistor when the second voltage level is on the power supply node. In some embodiments, the first p-type transistor is configured to receive a signal, and the signal is configured to have a reference voltage level when the first voltage level is on the power supply node, and have a level of one half of the second voltage level when the second voltage level is on the power supply node. In some embodiments, the circuit includes a capacitive device coupled between the first input terminal of the amplifier and the reference node.

In some embodiments, a circuit includes a power supply node, a reference node, a signal portion including first and second inverters configured to generate respective first and second complementary signals, and a power portion including an output node, an amplifier coupled between the power supply and reference nodes, a first branch extending from the power supply node to the reference node, coupled to a non-inverting input terminal of the amplifier, and including a first switching device coupled between the first input terminal and the reference node, a second branch extending from the power supply node to the reference node, coupled to an inverting input terminal of the amplifier, and including a p-type transistor coupled to an output terminal of the amplifier and the output node, and a second switching device coupled between the output node and the second input terminal, and a third switching device coupled between the power supply and output nodes. The power portion is configured to, responsive to the first and second signals having first logic levels corresponding to the power supply node having a first voltage level, switch off each of the first and second switching devices and switch on the third switching device, and responsive to the first and second signals having second logic levels corresponding to the power supply node having a second voltage level on the power supply node greater than the first voltage level, switch on each of the first and second switching devices and switch off the third switching device. In some embodiments, each of the first and second inverters is coupled between the output node and the reference node. In some embodiments, the first and second inverters are configured to generate the first logic levels including the first signal having the first voltage level and the second signal having a reference voltage level, and generate the second logic levels including the first signal having the reference voltage level and the second signal having a voltage level equal to half the second voltage level. In some embodiments, the first switching device includes an n-type transistor configured to receive the second signal, and the second switching device includes a transmission gate configured to receive the first and second signals. In some embodiments, the first branch includes a first resistive device, diode, or diode-configured transistor coupled between the power supply node and the non-inverting input terminal of the amplifier, and a second resistive device, diode, or diode-configured transistor coupled between the non-inverting input terminal of the amplifier and the first switching device, and the second branch includes a third resistive device, diode, or diode-configured transistor coupled between the second switching device and the inverting input terminal of the amplifier, and a fourth resistive device, diode, or diode-configured transistor coupled between the inverting input terminal of the amplifier and the reference node. In some embodiments, one or more of the first, second, third, or fourth resistive device, diode, or diode-configured transistor includes a plurality of resistors, diodes, or diode-configured transistors coupled in series.

In some embodiments, a method of operating a dual mode circuit includes receiving a power supply voltage at a power supply node, in response to the power supply voltage having a first voltage level, using a first switching device to decouple a first input terminal of an amplifier from a reference node, the amplifier being configured to control an output voltage on an output node, using a second switching device to decouple a second input terminal of the amplifier from the output node, and using a third switching device to couple the output node to the power supply node, and in response to the power supply voltage having a second voltage level greater than the first voltage level, using the first switching device to couple the first input terminal to the reference node, using the second switching device to couple the second input terminal to the output node, and using the third switching device to decouple the output node from the power supply node. In some embodiments, each of using the first switching device to couple the first input terminal to the reference node and using the first switching device to decouple the first input terminal from the reference node includes using an n-type transistor, and each of using the second switching device to couple the second input terminal to the output node and using the second switching device to decouple the second input terminal from the output node includes using a transmission gate. In some embodiments, using the first switching device to couple the first input terminal to the reference node includes coupling the first input terminal to the reference node through a first resistive device, diode, or diode-configured transistor, and using the second switching device to couple the second input terminal to the output node includes coupling the second input terminal to the output node through a second resistive device, diode, or diode-configured transistor. In some embodiments, each of using the first switching device to couple the first input terminal to the reference node and using the first switching device to decouple the first input terminal from the reference node includes using a capacitive device to capacitively couple the first input terminal to the reference node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A circuit comprising:
a power supply node;
a reference node;
an output node;
an amplifier coupled between the power supply and reference nodes;
a first branch extending from the power supply node to the reference node, coupled to a first input terminal of the amplifier, and comprising a first switching device coupled between the first input terminal and the reference node;
a second branch extending from the power supply node to the reference node, coupled to the output node and a second input terminal of the amplifier, and comprising a second switching device coupled between the output node and the second input terminal; and
a third switching device coupled between the power supply and output nodes,
wherein the circuit is configured to
responsive to a first voltage level on the power supply node, switch off each of the first and second switching devices and switch on the third switching device, and
responsive to a second voltage level on the power supply node greater than the first voltage level, switch on each of the first and second switching devices and switch off the third switching device.
2. The circuit of claim 1, wherein
each of the first and second switching devices is configured to receive a first signal, and
the first signal is configured to have logically high and low voltage levels corresponding to the respective first and second voltage levels on the power supply node.
3. The circuit of claim 2, wherein
the first switching device comprises an n-type transistor, and
the second switching device comprises a transmission gate further configured to receive a second signal complementary to the first signal.
4. The circuit of claim 1, wherein the first branch further comprises:
a first resistive device, diode, or diode-configured transistor coupled between the power supply node and the first input terminal of the amplifier; and
a second resistive device, diode, or diode-configured transistor coupled between the first input terminal of the amplifier and the first switching device.

5. The circuit of claim 4, wherein one or both of the first or second resistive device, diode, or diode-configured transistor comprises a plurality of resistors, diodes, or diode-configured transistors coupled in series.

6. The circuit of claim 4, wherein one or both of the first or second resistive device, diode, or diode-configured transistor comprises a plurality of resistors, diodes, or diode-configured transistors coupled in series.

7. The circuit of claim 1, wherein the second branch further comprises:
a first resistive device, diode, or diode-configured transistor coupled between the second switching device and the second input terminal of the amplifier; and
a second resistive device, diode, or diode-configured transistor coupled between the second input terminal of the amplifier and the reference node.

8. The circuit of claim 1, wherein
the second branch comprises first and second p-type transistors coupled in series between the power supply node and the output node,
the circuit is configured to switch on the first p-type transistor responsive to each of the first and second voltage levels on the power supply node, and
the amplifier is configured to switch off the second p-type transistor when the first voltage level is on the power supply node, and control current flow through the second p-type transistor when the second voltage level is on the power supply node.

9. The circuit of claim 8, wherein
the first p-type transistor is configured to receive a signal, and
the signal is configured to have a reference voltage level when the first voltage level is on the power supply node, and have a level of one half of the second voltage level when the second voltage level is on the power supply node.

10. The circuit of claim 1, further comprising a capacitive device coupled between the first input terminal of the amplifier and the reference node.

11. A circuit comprising:
a power supply node;
a reference node;
a signal portion comprising first and second inverters configured to generate respective first and second complementary signals; and
a power portion comprising:
an output node;
an amplifier coupled between the power supply and reference nodes;
a first branch extending from the power supply node to the reference node, coupled to a non-inverting input terminal of the amplifier, and comprising a first switching device coupled between the first input terminal and the reference node;
a second branch extending from the power supply node to the reference node, coupled to an inverting input terminal of the amplifier, and comprising a p-type transistor coupled to an output terminal of the amplifier and the output node, and a second switching device coupled between the output node and the second input terminal; and
a third switching device coupled between the power supply and output nodes,
wherein the power portion is configured to
responsive to the first and second signals having first logic levels corresponding to the power supply node having a first voltage level, switch off each of the first and second switching devices and switch on the third switching device, and
responsive to the first and second signals having second logic levels corresponding to the power supply node having a second voltage level on the power supply node greater than the first voltage level, switch on each of the first and second switching devices and switch off the third switching device.

12. The circuit of claim 11, wherein each of the first and second inverters is coupled between the output node and the reference node.

13. The circuit of claim 12, wherein the first and second inverters are configured to
generate the first logic levels comprising the first signal having the first voltage level and the second signal having a reference voltage level, and
generate the second logic levels comprising the first signal having the reference voltage level and the second signal having a voltage level equal to half the second voltage level.

14. The circuit of claim 13, wherein
the first switching device comprises an n-type transistor configured to receive the second signal, and
the second switching device comprises a transmission gate configured to receive the first and second signals.

15. The circuit of claim 11, wherein
the first branch further comprises:
a first resistive device, diode, or diode-configured transistor coupled between the power supply node and the non-inverting input terminal of the amplifier; and
a second resistive device, diode, or diode-configured transistor coupled between the non-inverting input terminal of the amplifier and the first switching device; and
the second branch further comprises:
a third resistive device, diode, or diode-configured transistor coupled between the second switching device and the inverting input terminal of the amplifier; and
a fourth resistive device, diode, or diode-configured transistor coupled between the inverting input terminal of the amplifier and the reference node.

16. The circuit of claim 15, wherein one or more of the first, second, third, or fourth resistive device, diode, or diode-configured transistor comprises a plurality of resistors, diodes, or diode-configured transistors coupled in series.

17. A method of operating a dual mode circuit, the method comprising:
receiving a power supply voltage at a power supply node;
in response to the power supply voltage having a first voltage level:
using a first switching device to decouple a first input terminal of an amplifier from a reference node, the amplifier being configured to control an output voltage on an output node,
using a second switching device to decouple a second input terminal of the amplifier from the output node, and
using a third switching device to couple the output node to the power supply node; and
in response to the power supply voltage having a second voltage level greater than the first voltage level:
using the first switching device to couple the first input terminal to the reference node,
using the second switching device to couple the second input terminal to the output node, and using the third switching device to decouple the output node from the power supply node.

18. The method of claim 17, wherein each of the using the first switching device to couple the first input terminal to the reference node and the using the first switching device to decouple the first input terminal from the reference node comprises using an n-type transistor, and each of the using the second switching device to couple the second input terminal to the output node and the using the second switching device to decouple the second input terminal from the output node comprises using a transmission gate.

19. The method of claim 17, wherein the using the first switching device to couple the first input terminal to the reference node comprises coupling the first input terminal to the reference node through a first resistive device, diode, or diode-configured transistor, and the using the second switching device to couple the second input terminal to the output node comprises coupling the second input terminal to the output node through a second resistive device, diode, or diode-configured transistor.

20. The method of claim 17, wherein each of the using the first switching device to couple the first input terminal to the reference node and the using the first switching device to decouple the first input terminal from the reference node comprises using a capacitive device to capacitively couple the first input terminal to the reference node.

* * * * *